(12) United States Patent
Delprat et al.

(10) Patent No.: US 8,946,053 B2
(45) Date of Patent: Feb. 3, 2015

(54) METHOD FOR REDUCING IRREGULARITIES AT THE SURFACE OF A LAYER TRANSFERRED FROM A SOURCE SUBSTRATE TO A GLASS-BASED SUPPORT SUBSTRATE

(75) Inventors: Daniel Delprat, Crolles (FR); Carine Duret, Grenoble (FR); Nadia Ben-Mohamed, Renage (FR); Fabrice Lallement, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/702,062

(22) PCT Filed: Jun. 20, 2011

(86) PCT No.: PCT/EP2011/060251
§ 371 (c)(1),
(2), (4) Date: Dec. 4, 2012

(87) PCT Pub. No.: WO2012/000821
PCT Pub. Date: Jan. 5, 2012

(65) Prior Publication Data
US 2013/0071997 A1    Mar. 21, 2013

Related U.S. Application Data

(63) Continuation of application No. 12/827,582, filed on Jun. 30, 2010, now Pat. No. 8,357,974.

(30) Foreign Application Priority Data

Dec. 28, 2010  (FR) ..................................... 10 61302

(51) Int. Cl.
*H01L 29/02* (2006.01)
*H01L 21/762* (2006.01)
*H01L 21/18* (2006.01)

(52) U.S. Cl.
CPC .......... *H01L 29/02* (2013.01); *H01L 21/76254* (2013.01); *H01L 21/185* (2013.01); *H01L 21/762* (2013.01)
USPC .............. 438/458; 257/E21.32; 257/E21.568; 438/311; 438/455

(58) Field of Classification Search
USPC ............. 257/E21.32, E21.568; 438/311, 455, 438/458
See application file for complete search history.

(56) References Cited

U.S. PATENT DOCUMENTS

| 5,347,564 A | 9/1994 | Davis et al. |
| 6,599,814 B1 | 7/2003 | Vanhaelemeersch et al. |

(Continued)

FOREIGN PATENT DOCUMENTS

WO    WO 2007/127074 A2    11/2007

OTHER PUBLICATIONS

International Search Report, PCT/EP2011/060251, mailed Aug. 1, 2011.

(Continued)

*Primary Examiner* — Asok K Sarkar
(74) *Attorney, Agent, or Firm* — TraskBritt

(57) ABSTRACT

A method for reducing irregularities at a surface of a layer transferred from a source substrate to a glass-based support substrate, by generating a weakening zone in the source substrate; contacting the source substrate and the glass-based support substrate; and splitting the source substrate at the weakening zone; wherein the glass-based substrate has a thickness of between 300 µm and 600 µm.

14 Claims, 8 Drawing Sheets

(56) References Cited

U.S. PATENT DOCUMENTS

| | | | |
|---|---|---|---|
| 7,176,528 B2 | 2/2007 | Couillard et al. | 257/347 |
| 7,446,010 B2 | 11/2008 | Li et al. | |
| 7,456,057 B2 | 11/2008 | Gadkaree et al. | |
| 2004/0224482 A1 | 11/2004 | Kub et al. | |
| 2007/0048968 A1* | 3/2007 | Couillard et al. | 438/455 |
| 2007/0127074 A1 | 6/2007 | Hayaishi | 358/3.01 |
| 2007/0249139 A1 | 10/2007 | Gadkaree et al. | 438/458 |
| 2008/0308897 A1 | 12/2008 | Kakehata et al. | 257/507 |
| 2009/0032873 A1 | 2/2009 | Cites et al. | |
| 2009/0133811 A1 | 5/2009 | Moriceau et al. | |
| 2010/0127343 A1 | 5/2010 | Daigler et al. | |
| 2011/0115045 A1 | 5/2011 | Kakehata et al. | 257/506 |

OTHER PUBLICATIONS

C Mazure, et al., "Advanced Electronic Substrates for the Nanotechnology Era," The Electrochemical Society Interface, Winter 2006, pp. 33-40.

R.W. Bower, et al., "Low temperature Si.sub.3N.sub.4 direct bonding," Appl. Phys. Lett., vol. 62, No. 26, Jun. 28, 1993, pp. 3485-3487.

G.K. Celler, et al., "Frontiers of silicon-on-insulator," Applied Physics Reviews—Focused Review, Journal of Applied Physics, vol. 93, No. 9, May 1, 2003, pp. 4955-4978.

"CVD in Electronic Applications: Conductors, Insulators, and Diffusion Barriers", Handbook of Chemical Vapor Deposition, 1999, pp. 367-383.

D.M. Hansen, et al., "Chemical role of oxygen plasma in wafer bonding using borosilicate glasses," Applied Physics Letters, vol. 79, No. 21, Nov. 19, 2001, pp. 3413-3415.

D.M. Hansen, et al., "Plasma Induced Chemical Changes at Silica Surfaces During Pre-Bonding Treatments," Mat. Res. Soc. Symp. Proc., vol. 681E, 2001 Materials Research Society, pp. I2.2.1-I2.2.6.

R. Klockenkamper, et al., "Depth profiling of a Co-implanted silicon wafer by total-reflection X-ray fluorescence analysis after repeated oxidation and HF-etching," Anal. Commun., 1999, vol. 36, pp. 27-29.

D. Pasquariello, et al., "Surface energy as a function of self-bias voltage in oxygen plasma wafer bonding," Sensor and Actuators, vol. 82, 2000, pp. 239-244.

S.M. Sze, et al., Physics of Semiconductor Devices, Third Edition, Chapter 4, Metal-Insulator-Semiconductor Capacitors, 2007, p. 224.

* cited by examiner

METHOD FOR REDUCING IRREGULARITIES AT THE SURFACE OF A LAYER TRANSFERRED FROM A SOURCE SUBSTRATE TO A GLASS-BASED SUPPORT SUBSTRATE

FIELD OF THE INVENTION

The field of this invention is that of Silicon On Glass (SiOG) structures.

More precisely, the invention relates to an improved method for making such structures.

BACKGROUND OF THE INVENTION

Silicon On Insulator (SOI) technology is becoming increasingly important for high performance thin film transistors, solar cells, etc. SOI wafers consist of a thin layer of substantially single crystal silicon (generally less than one micron) on an insulating material.

Various structures and various ways of obtaining such wafers are known. Typically, used structures are formed with a thin film of single crystalline silicon 0.01-2 µm in thickness bonded to another silicon wafer with an oxide insulator layer in between.

Because of its rather high thickness, in particular as compared to the other parts, a major fraction of the cost of such structures has been the cost of the silicon substrate that supports the oxide layer, topped by the thin silicon layer. Thus, to lower the cost of SOI structures, the use of support substrate made of materials less expensive than silicon has been tried, in particular glass or glass-ceramics.

SOI structures using such glass-based substrates are called SiOG structures, as already mentioned. Processes for providing a SiOG structure are, for example, described by U.S. Pat. No. 7,176,528. Such a process is represented by FIG. 1. A source substrate 1, generally made of silicon, is oxidized and implanted with ionic species 6 such as hydrogen. The implantation leads to the creation of a buried, weakened zone 2. Further, the source substrate 1 is bonded with a glass-based support substrate 3 and then separated by splitting the source substrate 1 at a depth corresponding to the penetration depth of the implanted species 6 (the separation zone 2). In this way, a SiOG structure containing the original glass-based support substrate 3 and a layer 4 originating from the source substrate 1, and a remaining delaminated substrate being a part of the former source substrate 1 are produced.

However, it is not a simple matter to replace a traditional silicon support substrate with a glass-based support substrate. One potential concern with SiOG is that the glass-based support substrate 3 contains metal (in particular alkalis) and other components that may be harmful to the silicon or other semiconductor layer 4. Therefore, a barrier layer may be required between the glass-based support substrate 3 and the silicon layer 4 in the SiOG. In some cases, this barrier layer facilitates the bonding of the silicon layer 4 to the glass-based support substrate 3 by making the bonding surface of the silicon layer 4 hydrophilic. In this regard, one $SiO_2$ layer may be used to obtain hydrophilic surface conditions between the glass-based support substrate 3 and the silicon layer 4.

A native $SiO_2$ layer may be formed on the silicon source substrate 1 when it is exposed to the atmosphere prior to bonding. Additionally, the anodic bonding process produces "in situ" $SiO_2$ layer between the silicon source substrate 1 and the glass-based support substrate 3. If desired, one $SiO_2$ layer may be actively deposited or grown on the source substrate 1 prior to bonding. Another type of a barrier layer provided by the anodic bonding process disclosed in U.S. Pat. No. 7,176,528 is a modified layer of glass in the glass-based support substrate adjacent to the silicon layer with a reduced level of ions. Anodic bonding substantially removes alkali and alkali earth glass constituents and other positive modifier ions that are harmful for silicon from about 100 nm thick region in the surface of glass adjoining the bond interface.

Glass material differs also on some other physical properties when compared to traditional silicon support as, for example, stiffness and this limited compatibility with silicon has an impact on the surface texture of the transferred layer 4 of a SiOG structure.

Indeed, splitting the source substrate at the separation zone generates particularly numerous and deep surface irregularities, as represented in FIG. 2. It combines plateaus 41, which surface presents microroughnesses 42, the plateaus being encircled by pits 43 named "canyons." Such surface irregularities have to be eliminated, and a chemical-mechanical polishing (CMP) is classically performed to that effect. However, such polishing is long and expensive, in particular if the plateaus present a high-density of microroughnesses 42. Moreover, the more the canyons 43 are deep, the more the layer of material to be removed by polishing is thick. An important amount of high-grade silicon is therefore wasted. According to FIG. 3, which represents the profile of a transversal section, the band to be removed can have a thickness extending to 10 nm.

There is consequently a need for a solution for reducing the depth and the density of canyons, and for limiting the microroughnesses.

SUMMARY OF THE INVENTION

The aim of the present invention is to provide a method for making improved-quality SiOG structures in which the surface of separation between the layer transferred to the glass-based support substrate and the rest of the source substrate presents reduced surface irregularities, in particular, with a decrease of the surface area of plateaus and a decrease of the number and depth of canyons encircling the plateaus.

Moreover, the present invention also aims at avoiding the need for long CMP polishing, in order to speed up industrial processes, and save raw materials.

For these purposes, the present invention provides a method for reducing irregularities at the surface of a layer transferred from a source substrate to a glass-based support substrate, wherein said transfer comprises the steps of:

(a) generating a weakening zone in the source substrate;

(b) contacting the source substrate and the glass-based support substrate; and (c) splitting the source substrate at the weakening zone; characterized in that the thickness of the glass-based substrate is comprised between 300 µm and 600 µm.

Preferred but nonlimiting features of the present invention are as follows:

the thickness of the glass-based substrate is comprised between 300 µm and 500 µm;

the thickness of the glass-based substrate is comprised between 300 µm and less than 500 µm;

the thickness of the glass-based substrate is comprised between 350 µm and 450 µm;

the source substrate has a bonding surface and the glass-based support substrate has a bonding surface, the layer to be transferred from the source substrate to the glass-based support substrate being defined in between the bonding surface and the weakening zone of the source substrate, and wherein step (b) consists of contacting the bonding surface of the source substrate and the bonding surface of the glass-based support substrate;

the glass-based support substrate is entirely made of glass;

at least one superficial layer is intercalated between the glass-based support substrate and the layer, the at least one superficial layer being made of a material chosen among at least one of the following materials: SiO2, SiNx;

the at least one superficial layer is a bilayer of SiNx/SiO2;

the at least one superficial layer is formed on the glass-based support substrate;

the at least one superficial layer is a trilayer of SiO2/SiNx/SiO2 formed on the donor substrate;

the thickness of each superficial layer is comprised between 10 nm and 200 nm;

step (a) is performed by successive co-implantation of Helium and Hydrogen ions;

the source substrate is made of a material chosen among at least one of the following materials: Si, SIC, SiGe; and the thickness of the transferred layer is comprised between 0.01 μm and 2 μm.

BRIEF DESCRIPTION OF THE DRAWINGS

The above and other objects, features and advantages of this invention will be apparent in the following detailed description of an illustrative embodiment thereof, which is to be read in connection with the accompanying drawings wherein.

DETAILED DESCRIPTION OF A PREFERRED EMBODIMENT

Figure 1:
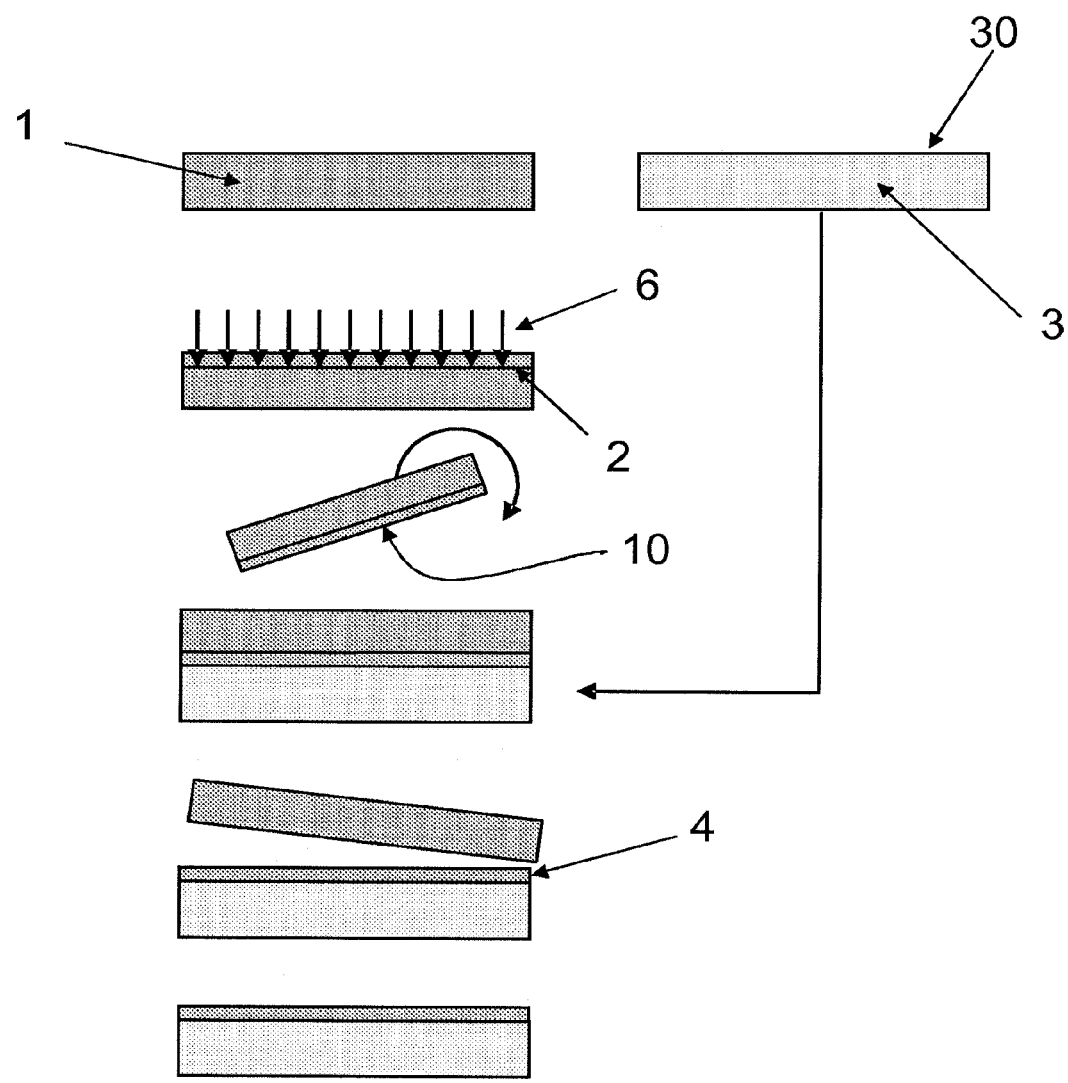
FIG. 1, previously described, represents steps of a known process for making SiOG structures.
Figure 2:
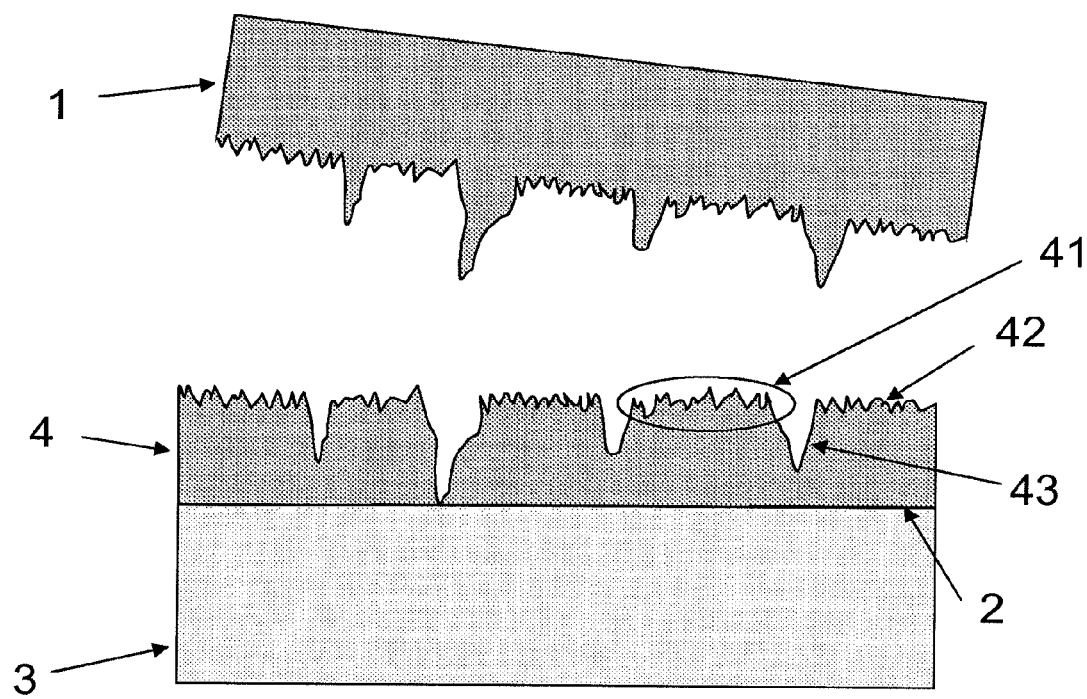
FIG. 2, previously described, represents surface irregularities likely to appear when splitting a source substrate.
Figure 3:
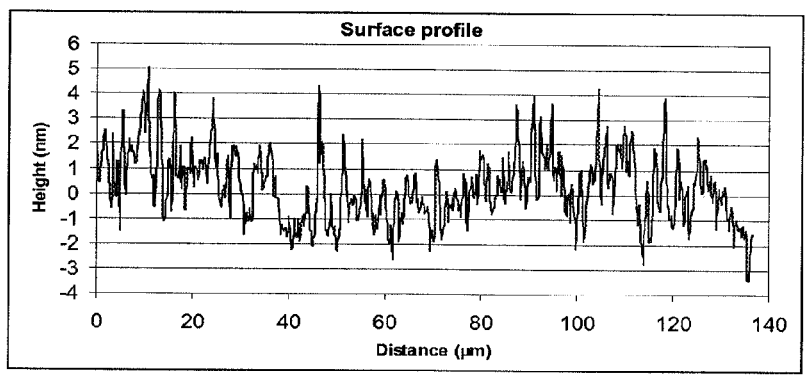
FIG. 3, previously described, is a surface height profile of a source substrate after layer transfer.

Referring to the drawings, a method according to a possible embodiment of the invention will now be described.

Glass is a material with a limited stiffness, with a Young's modulus of about 74 GPa. Most metals have a higher stiffness, and silicon has, for example, a Young's modulus varying from 130 GPa for [100] crystallographic orientation and up to 189 GPa for [111] orientation.

Commonly used support substrates are advantageously entirely made of glass, and their thickness lies between 500 μm and 750 μm according to their application, while the transferred single crystalline layer 4 has a thickness varying between 0.01 μm to 2 μm.

The applicant has surprisingly discovered that the thickness of the glass-based support substrate 3 appears to have an impact on the density and the depth of surface irregularities at the separation zone 2 of the source substrate 1.

Figure 4A:
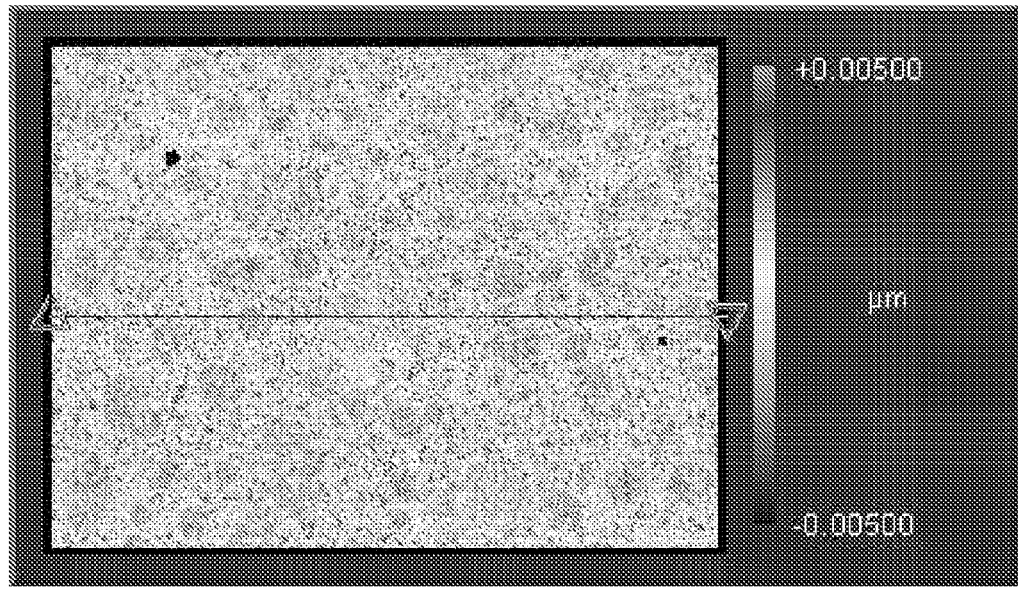
FIGS. 4a and 4b are optical profilometry images comparing the surface of layers transferred according to a known method, and according to an embodiment of the invention.
Figure 4B:
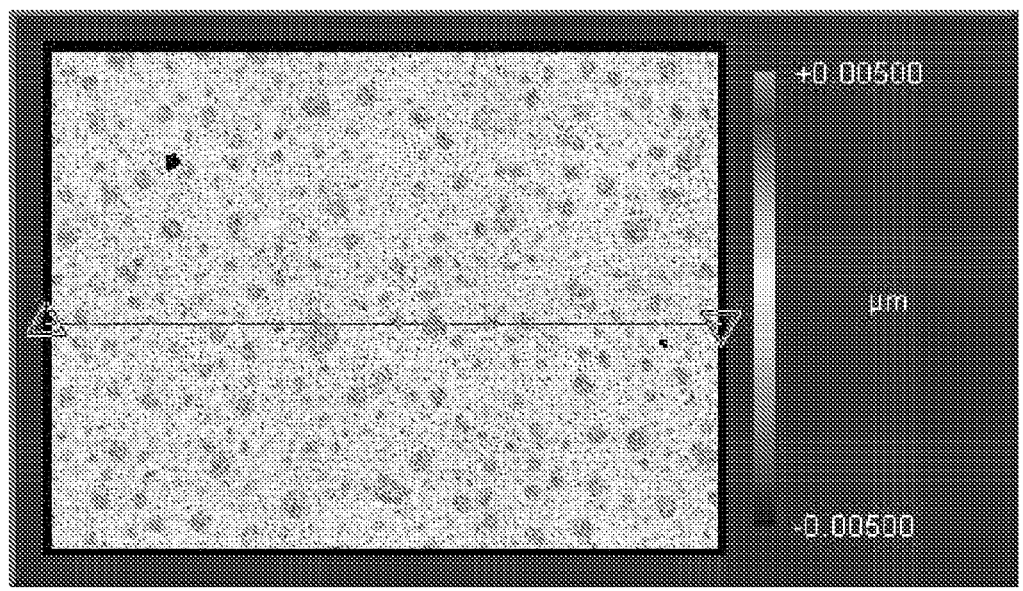

In this respect, FIGS. 4a and 4b are optical profilometry images representing the surface of a silicon source substrate 1 from which a 0.35 μm thick layer 4 has been taken off and transferred onto a glass-based support substrate 3, where the glass-based support substrate has, respectively, a thickness of 700 μm and 500 μm. This is a "negative" view of the surface of the transferred layers. The total surface of plateaus 41 appears to be less important when the support substrate is thinner. The size of the images is 140×100 μm².

Figure 5:
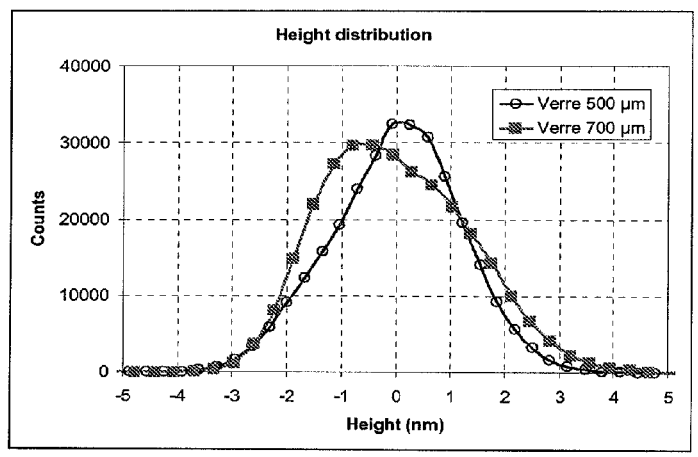
FIG. 5 is a graph comparing the height distribution of points of the surface of layers transferred according to a known method, and according to an embodiment of the invention.

The height distribution of points of these profilometry images has then been studied, and results are graphically represented on FIG. 5. As it can be seen, with a substrate having a thickness of 700 μm, the regular points (with a null height) are not the most numerous, contrary to the points having a depth of nearly 1 nm (as the profilometry has been applied to "negative" source substrate, these pits corresponds to plateaus on the transferred layer). However, with a substrate having a thickness of 500 μm, the regular points become the most numerous.

These two examples suggest that a glass-based substrate 3 with a thickness of 500 μm should be preferred to a glass-based substrate 3 with a thickness of 700 μm.

Statistical tests were conducted on optical profilometry images (640×480 pixels) made on five areas (one at the center, and four at 15 mm from the edge) of the surface of 200 mm diameter source substrates 1 from which thin layers 4 have been taken off and transferred onto glass substrates of a plurality of different thicknesses. These tests confirm the importance of the thickness of the glass-based support substrate and determine an optimal range.

Thus, three parameters have been taken into account:

a RMS parameter (Root Mean Square), which corresponds to the average height (or depth) with respect to the medium plane of an irregularity of the surface;

$$RMS = \sqrt{\frac{\sum_{i=1}^{n} z_i^2}{n}}$$

a skewness parameter, which could be resumed as an asymmetry coefficient. It shows if, for example, canyons are more numerous than peaks and reciprocally;

$$Skewness = \frac{1}{RMS^3} \frac{1}{n} \sum_{i=1}^{n} z_i^3$$

a R3z parameter, which measures the difference between the fourth "highest" and fourth "lowest" points on the surface (the three highest and the three lowest are not taken into account to avoid measure artifacts).

Figure 6A:
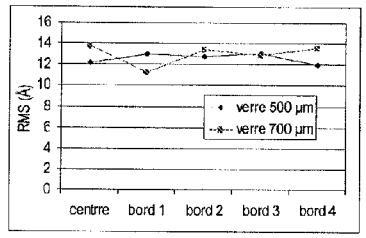
FIGS. 6a-6c are graphs comparing three statistical parameters of the surface of layers transferred according to a known method, and according to an embodiment of the invention.
Figure 6B:
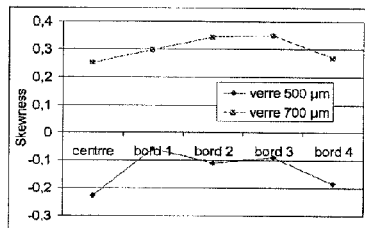
Figure 6C:
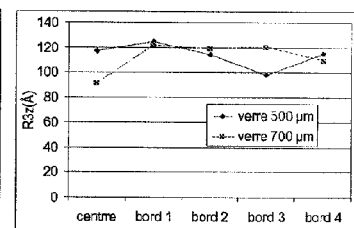

Results of these tests are exposed for glass-based substrates having a thickness of 500 μm and 700 μm in the three graphs of FIGS. 6a-6c. Whereas values of RMS and R3z are similar whatever the thickness of the glass-based substrate 3, skewness values are significantly inferior in absolute value in the case of a 500 μm glass-based substrate 3. It proves that canyons are less numerous and/or less deep when the substrate is thinner.

As fragility of the glass-based substrate 3 increases when it becomes thinner, the range of thickness for effectively reducing surface irregularities in the case of an industrial use is between 300 μm and 600 μm, preferably between 300 μm and 500 μm, in particular between 300 μm and less than 500 μm, even more in particular between 350 μm and 450 μm.

In this respect, the method for reducing irregularities at the surface of a layer 4 transferred from a source substrate 1 to a glass-based support substrate 3 according to the invention comprises the steps of:

(a) generating a weakening zone 2 in the source substrate 1;
(b) contacting the source substrate 1 and the glass-based support substrate 3, said step advantageously consisting of contacting a bonding surface 10 of the source substrate 1 and a bonding surface 30 of the glass-based support substrate 3, the layer 4 to be transferred from the source substrate 1 to the glass-based support substrate 3 being defined in between the bonding surface 10 and the weakening zone 2;
(c) splitting the source substrate 1 at the weakening zone 2; and
the glass-based substrate being chosen for having a thickness comprised between 300 μm and 600 μm, preferably between 300 μm and 500 μm, in particular between 300 μm and less than 500 μm, even more in particular between 350 μm and 450 μm.

Silicon Nitride/Silicon Oxide Layers

Figure 7:
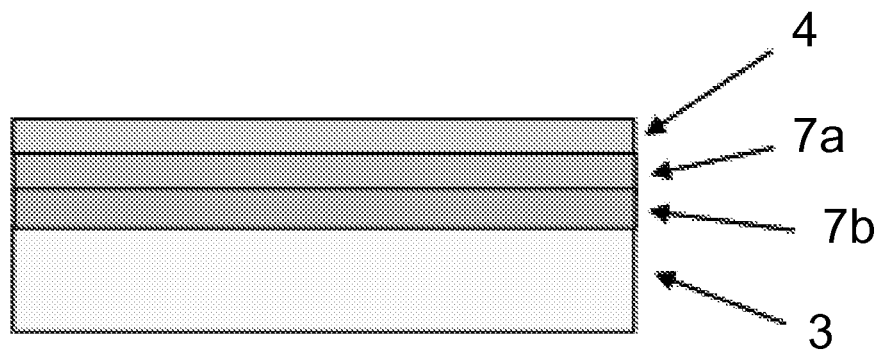
FIG. 7 is a transversal section of a SiOG structure made according to an embodiment of the invention.

Advantageously, for alternatives purposes, at least one superficial layer 7 may have to be intercalated between the glass-based support substrate 3 and the layer 4, as represented in FIG. 7. Such layers 7 may be made of a material chosen among at least one of the following materials: SiO2, SiNx. More advantageously, there is one layer 7a of SiO2 and one layer 7b of SiNx, more advantageously a bilayer of SiNx/SiO2 ("NO") is formed, and even more advantageously, a trilayer of SiO2/SiNx/SiO2 ("ONO") is formed. Such an ONO structure provides an optimal density of interface traps.

The impact of the glass-based substrate thickness was also studied in such a configuration of a silicon on insulator structure. The manufacturing process in the case of a bilayer NO or a trilayer ONO follows the already explained steps represented in FIG. 1, additional layers 7 being deposited either on the source substrate before the generation of the weakened layer 2, or on the glass substrate prior to the bonding step. The contact of step (b) is thus made between the source wafer surface and the deposited layers 7. These layers 7 of SiO2 or SiNx have advantageously a thickness comprised between 10 nm and 200 nm.

Figure 8A:
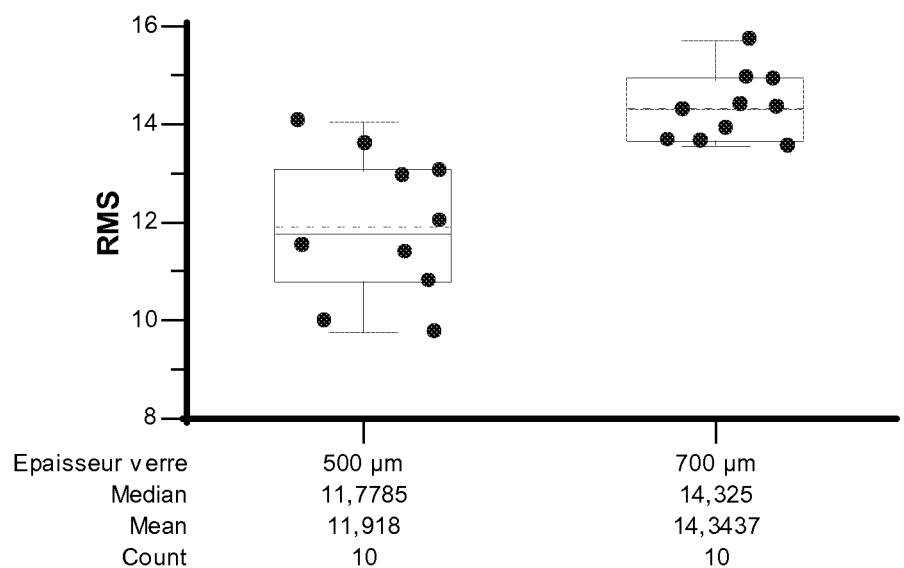
FIGS. 8a-8c are graphs comparing three statistical parameters of the surface of layers transferred according to a known method, and according to an embodiment of the invention.
Figure 8B:
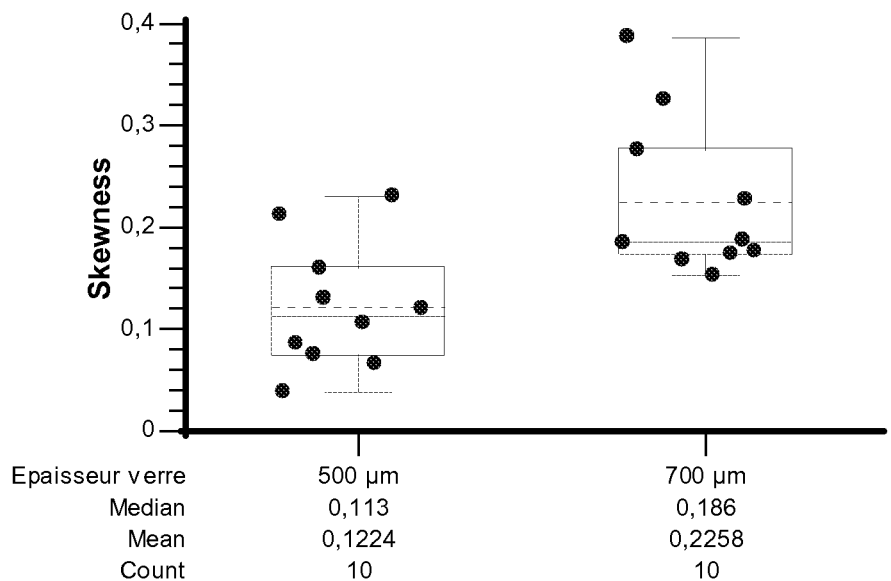
Figure 8C:
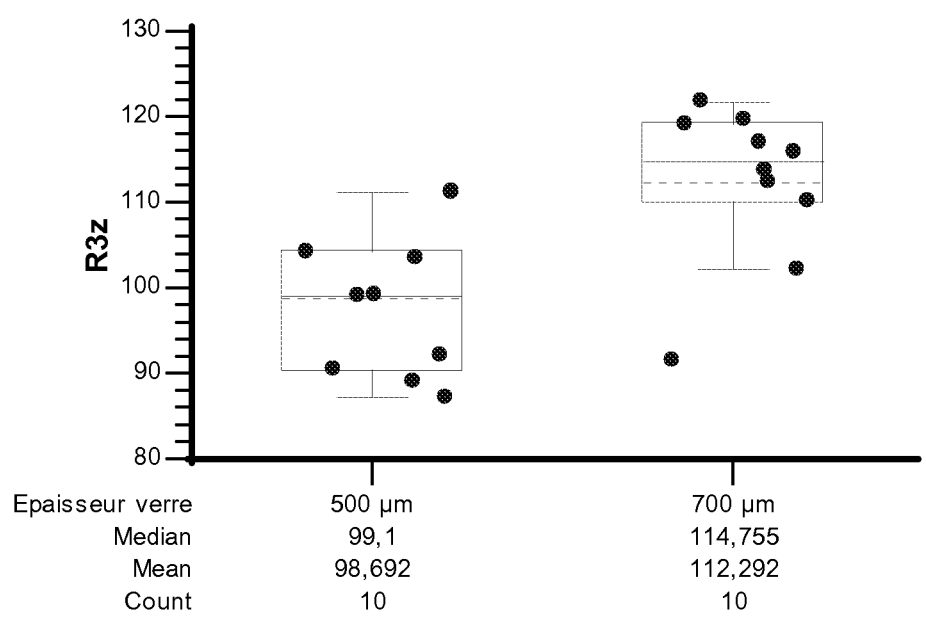

As in the previous experiments, optical profilometry was performed on five points of four "negative" source substrates 1 from which a 0.35 μm thick layer 4 was transferred for making four layered structures as represented in FIG. 7 (silicon nitride and silicon oxide layers have the same thickness of 50 nm), the glass-based substrate 3 being 700 microns thick for two of them, and 500 microns thick for the other two; ten points of measurements are thus available for each glass thickness. FIG. 8a-8c show box plot graphs of the ten points for the three parameters previously used: RMS, skewness and R3z.

It can be observed that in this case the RMS average value is about 11.9 Å for a thickness of 500 μm, and about 14.3 Å for a thickness of 700 μm (+20%). For the same thicknesses, the skewness average value rises from about 0.12 to 0.23 (+92%), and the parameter R3Z average value rises from 99 Å to 112 Å (+12%). Thus all of the three parameters are improved when the glass-based substrate is thinner. These experiments prove that in the case of a structure comprising SiO2 and/or SiNx thin layers 7, density, depth and/or height of all surface irregularities of the transferred layer 4 are decreasing with diminution of thickness of the glass-based substrate 3.

In conclusion, the use of a thin glass-based substrate having a thickness between 300 μm and 600 μm, preferably between 300 μm and 500 μm, in particular between 300 μm and less than 500 μm, even more in particular between 350 μm and 450 μm, reduces the density and the depth of canyons of a SiOG structure. By adding a bilayer of silicon nitride and silicon oxide it is also possible to reduce the microroughness.

Figure 9A:
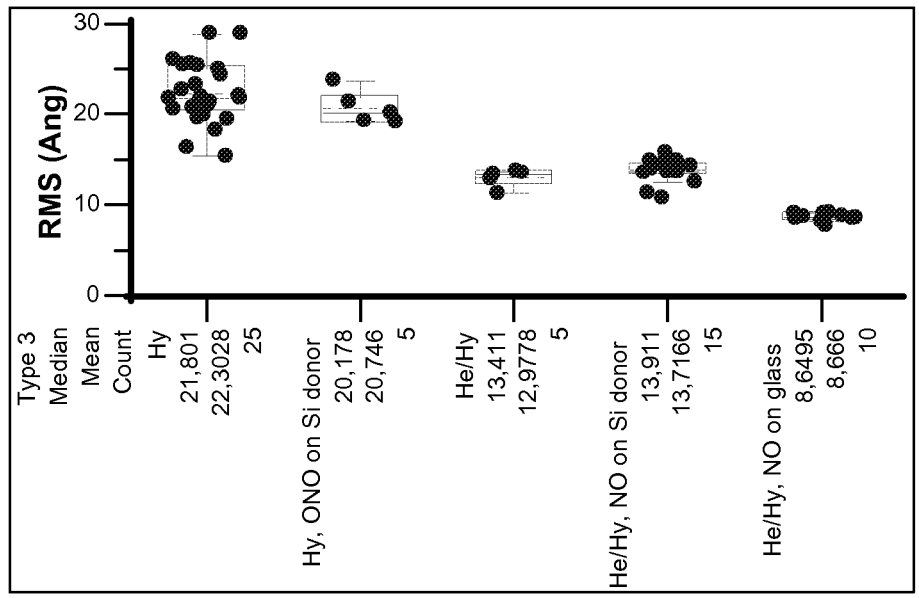
FIGS. 9a-9c are graphs comparing three statistical parameters of the surface of layers transferred according to five preferred embodiments of the invention.
Figure 9B:
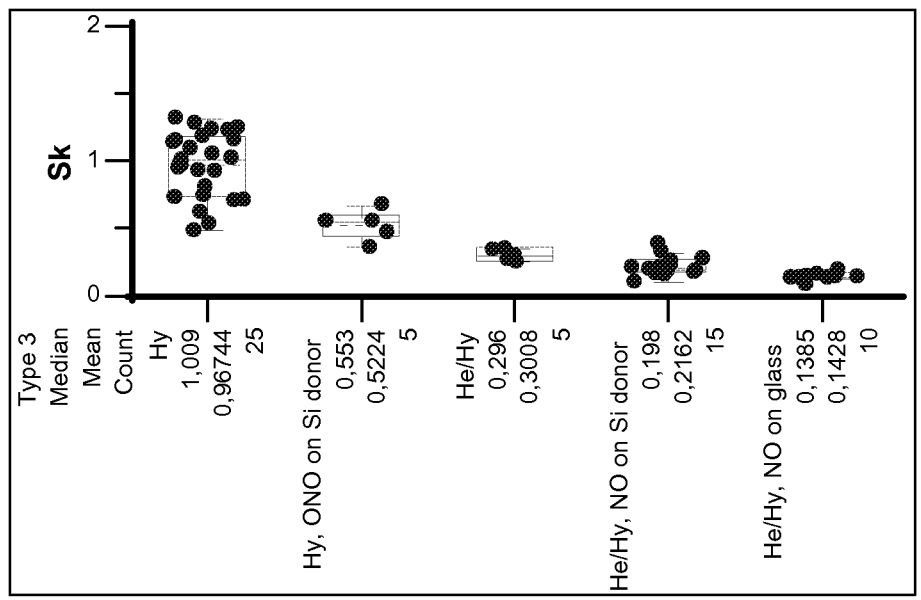
Figure 9C:
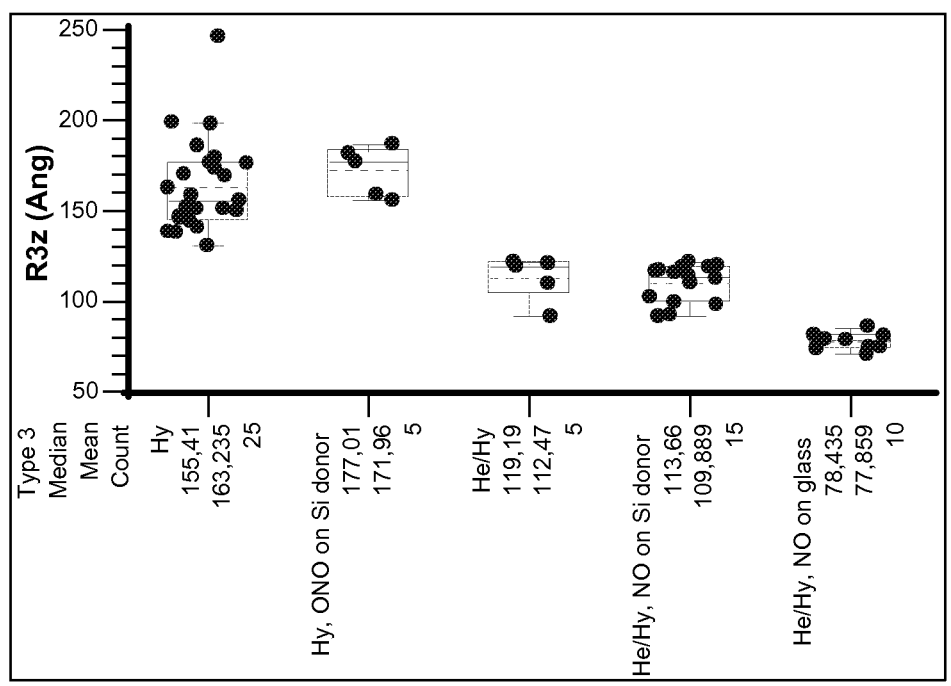

Moreover, as already mentioned, the silicon nitride layer and silicon oxide layer can be formed either on the source substrate 1 before the generation of the weakened layer 2, or on the glass substrate 3 prior to the bonding step. Besides, in the first case, such a formation could affect the generation of the weakened layer 2, as this generation step consists of implanting ionic species 6 in the source substrate 1, this time through the additional layers 7. To study the possible impact, more additional tests have been conducted, comparing again "negative" source substrates in the case of five of the most interesting structures, with a 500 μm thick glass substrate 3, the five associated results being represented by FIGS. 9a-9c:

1—Implantation of Hydrogen, no additional layer 7;
2—Implantation of Hydrogen, presence of trilayer ONO formed on the source substrate 1;
3—Successive co-implantation of Helium and Hydrogen (that is helium first, then hydrogen), no additional layer 7;
4—Successive co-implantation of Helium and Hydrogen, presence of a bilayer NO formed on the source substrate 1; and
5—Successive co-implantation of Helium and Hydrogen presence of a bilayer NO formed on the glass-based support substrate 3.

For each parameter, best results have been obtained in case 5 of a successive co-implantation of Helium and Hydrogen ions 6, and with a bilayer NO formed on the glass-based support substrate 3. With respect to a structure comprising a layer of Si directly transferred to a 700 μm glass-based support substrate, in the case of this particularly preferred structure #5, RMS is divided by a factor of two, Skewness is divided by a factor of ten, and R3z is divided by a factor of three.

What is claimed is:

1. A method for reducing irregularities at a surface of a layer transferred from a source substrate to a glass-based support substrate, which comprises:
    generating a weakening zone in the source substrate with the weakening zone defining the thickness of the layer to be transferred;
    contacting the source substrate and a glass-based support substrate that has a thickness of only between 300 μm and less than 500 μm; and
    splitting the source substrate at the weakening zone to transfer the layer to the glass-based support substrate.

2. The method according to claim 1, wherein the thickness of the glass-based substrate is between 350 μm and 450 μm.

3. The method according to claim 1, wherein the source substrate has a bonding surface and the glass-based support substrate has a bonding surface, and with the layer to be transferred from the source substrate to the glass-based support substrate being defined between the bonding surface and the weakening zone of the source substrate.

4. The method according to claim 3, wherein the contacting includes contacting the bonding surfaces of the source and glass-based support substrates.

5. The method according to claim 1, wherein the glass-based support substrate is entirely made of glass.

6. The method according to claim 1, which further comprises providing at least one superficial layer intercalated between the glass-based support substrate and the layer to be transferred, with the at least one superficial layer being made of a $SiO_2$ or $SiN_x$.

7. The method according to claim 6, wherein the at least one superficial layer is a bilayer of $SiN_x/SiO_2$.

8. The method according to claim 6, wherein the at least one superficial layer is formed on the glass-based support substrate.

9. The method according to claim 6, wherein the thickness of each superficial layer is between 10 mm and 200 nm.

10. The method according to claim 6, wherein the source substrate is made of Si, SiC, or SiGe.

11. The method according to claim 6, wherein the transfer layer has a thickness of between 0.01 μm and 2 μm.

12. The method according to claim 1, wherein the weakening layer is provided by the co-implantation of helium and hydrogen ions.

13. A method for reducing irregularities at a surface of a layer transferred from a source substrate to a glass-based support substrate, which comprises:
   generating a weakening zone in the source substrate with the weakening zone defining the thickness of the layer to be transferred;
   contacting the source substrate and a glass-based support substrate that has a thickness of only between 300 μm and less than 500 μm; and
   splitting the source substrate at the weakening zone to transfer the layer to the glass-based support substrate, wherein the at least one superficial layer is a trilayer of $SiO_2/SiN_x/SiO_2$ formed on the source substrate.

14. A method for reducing irregularities at a surface of a layer transferred from a source substrate to a glass-based support substrate, which comprises:
   generating a weakening zone in the source substrate with the weakening zone defining the thickness of the layer to be transferred;
   directly contacting the source substrate and a glass-based support substrate that has a thickness of only between 300 μm and less than 500 μm; and
   splitting the source substrate at the weakening zone to transfer the layer to the glass-based support substrate without intervening layers therebetween.

* * * * *

UNITED STATES PATENT AND TRADEMARK OFFICE
CERTIFICATE OF CORRECTION

PATENT NO. : 8,946,053 B2  
APPLICATION NO. : 13/702062  
DATED : February 3, 2015  
INVENTOR(S) : Daniel Delprat et al.

Page 1 of 1

It is certified that error appears in the above-identified patent and that said Letters Patent is hereby corrected as shown below:

In the specification:

| | | |
|---|---|---|
| COLUMN 3, | LINE 19, | change "SIC," to --SiC,-- |
| COLUMN 5, | LINE 59, | change "FIG. 8*a*-8*c*" to --FIGS. 8*a*-8*c*-- |

In the claims:

CLAIM 9, COLUMN 7, LINE 17, change "10 mm" to --10 nm--

Signed and Sealed this  
Twenty-ninth Day of September, 2015

Michelle K. Lee  
*Director of the United States Patent and Trademark Office*